US007090508B1

(12) United States Patent
Chen

(10) Patent No.: US 7,090,508 B1
(45) Date of Patent: Aug. 15, 2006

(54) BOARD-TO-BOARD CONNECTOR ASSEMBLY

(75) Inventor: Hsin-Ta Chen, Tu-Cheng (TW)

(73) Assignee: Cheng Uei Precision Industry Co., Ltd., Tapei Hsien (TW)

( * ) Notice: Subject to any disclaimer, the term of this patent is extended or adjusted under 35 U.S.C. 154(b) by 0 days.

(21) Appl. No.: 11/287,015

(22) Filed: Nov. 23, 2005

(51) Int. Cl.
*H01R 12/00* (2006.01)
*H05K 1/00* (2006.01)

(52) U.S. Cl. ......................... 439/74; 439/357; 439/571

(58) Field of Classification Search .................. 439/74, 439/350, 357, 571, 570
See application file for complete search history.

(56) References Cited

U.S. PATENT DOCUMENTS 5,836,773 A * 11/1998 McHugh et al. .............. 439/74

* cited by examiner

*Primary Examiner*—Javaid H. Nasri

(57) ABSTRACT

A board-to-board connector assembly for connecting two printed circuit boards together includes a female connector and a male connector. The female connector has a plurality of walls to form a mating channel and a pedestal formed in the mating channel. At least one locking projection is arranged on top portion of the wall and extends to the mating channel. The male connector includes a bottom board and a plurality of side boards to form a male housing coupling with the pedestal of the female connector. While the male connector is inserted in the female connector, the locking projection presses the bottom board of the male connector. Thereby, the female connector and the male connector of the board-to-board connector assembly are firmly engaged together.

2 Claims, 6 Drawing Sheets

BOARD-TO-BOARD CONNECTOR ASSEMBLY

BACKGROUND OF THE INVENTION

1. Field of the Invention

The present invention relates to a board-to-board connector assembly, and more particularly to a board-to-board connector assembly with improved locking mechanism for registering and holding male and female connectors together.

2. The Related Art

A board-to-board connector assembly generally contains a male connector and a female connector. Each of the connectors is fixed on a printed circuit board, respectively. Through the engagement of the male connector and the female connector, the printed circuit boards communicate with each other. But the trend of the electric industry is to constantly reduce the size of electric devices. Accordingly, the size of the connector becomes extremely small. The joint force is reduced too. In order to increase the joint force, a locking mechanism of the connector is required. Conventional locking mechanism comprises a locking projection formed on one connector and a locking cavity formed on another connector. Through the mating of the locking projection and the locking cavity, the connectors are engaged firmly. But because the connector is very small, the body or the wall of the connector becomes extremely thin. While several locking cavities are formed thereon, the connector becomes weak and easily broken when being hit.

Therefore, the present invention provides a board-to-board connector assembly with improved locking mechanism in order to overcome the aforementioned disadvantages and firmly hold the associated connectors together regardless of the size of the connectors.

SUMMARY OF THE INVENTION

Accordingly, an object of the present invention is to provide a board-to-board connector assembly comprising a male connector and a female connector. Each of the connectors has a plurality of welding holes and welding terminals. The welding terminal is fixed in the welding hole. The male connector includes a male body and a plurality of male terminals carried in the male body. The male body includes a bottom board, a plurality of side boards and a male housing surrounded by the side boards. The female connector includes a female body and a plurality of female terminals carried in the female body and coupled to the male terminals. The female body defines a plurality of walls, a pedestal surrounded by the walls and a mating channel to couple with the male body. A plurality of locking projections locate on the top portions of the walls and stretch to the mating channel. While the male body is inserted in the mating channel, the locking projections press the bottom board of the male body. Thereby the male connector and the female connector are firmly engaged together. Comparing with the conventional locking mechanism, this structure is simple. By adding locking projections without locking cavity, the strength of the body is increased and the break of the connector is avoided while being hit.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
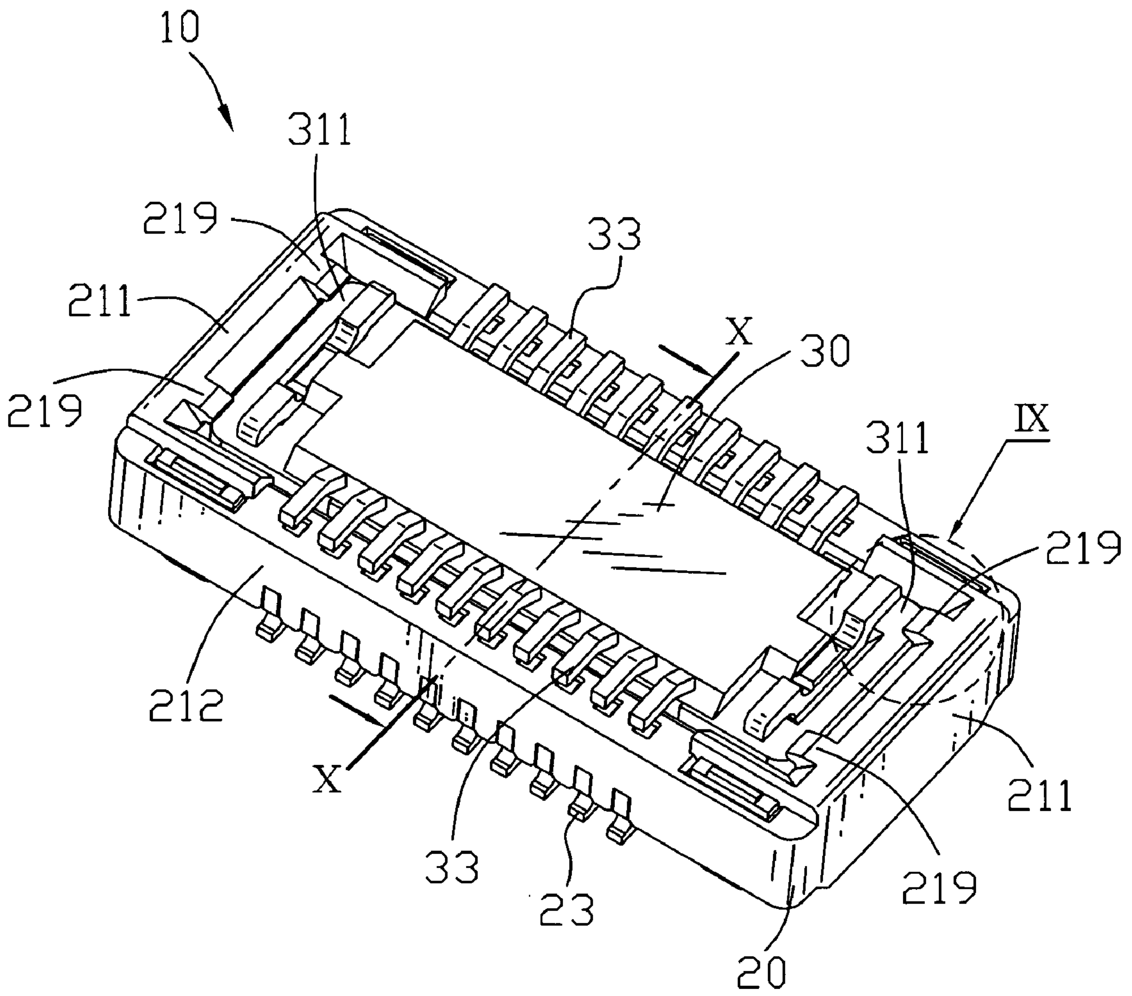
FIG. 1 is a perspective view of a board-to-board connector assembly in accordance with the present invention showing the engagement of a male connector and a female connector.

Referring to FIG. 1, an embodiment of a board-to-board connector assembly 10 constructed in accordance with the principles of the present invention is shown. The board-to-board connector assembly 10 comprises a female connector 20 and a male connector 30 for electrically connecting one printed circuit board (not shown) to another printed circuit board (not shown).

Figure 2:
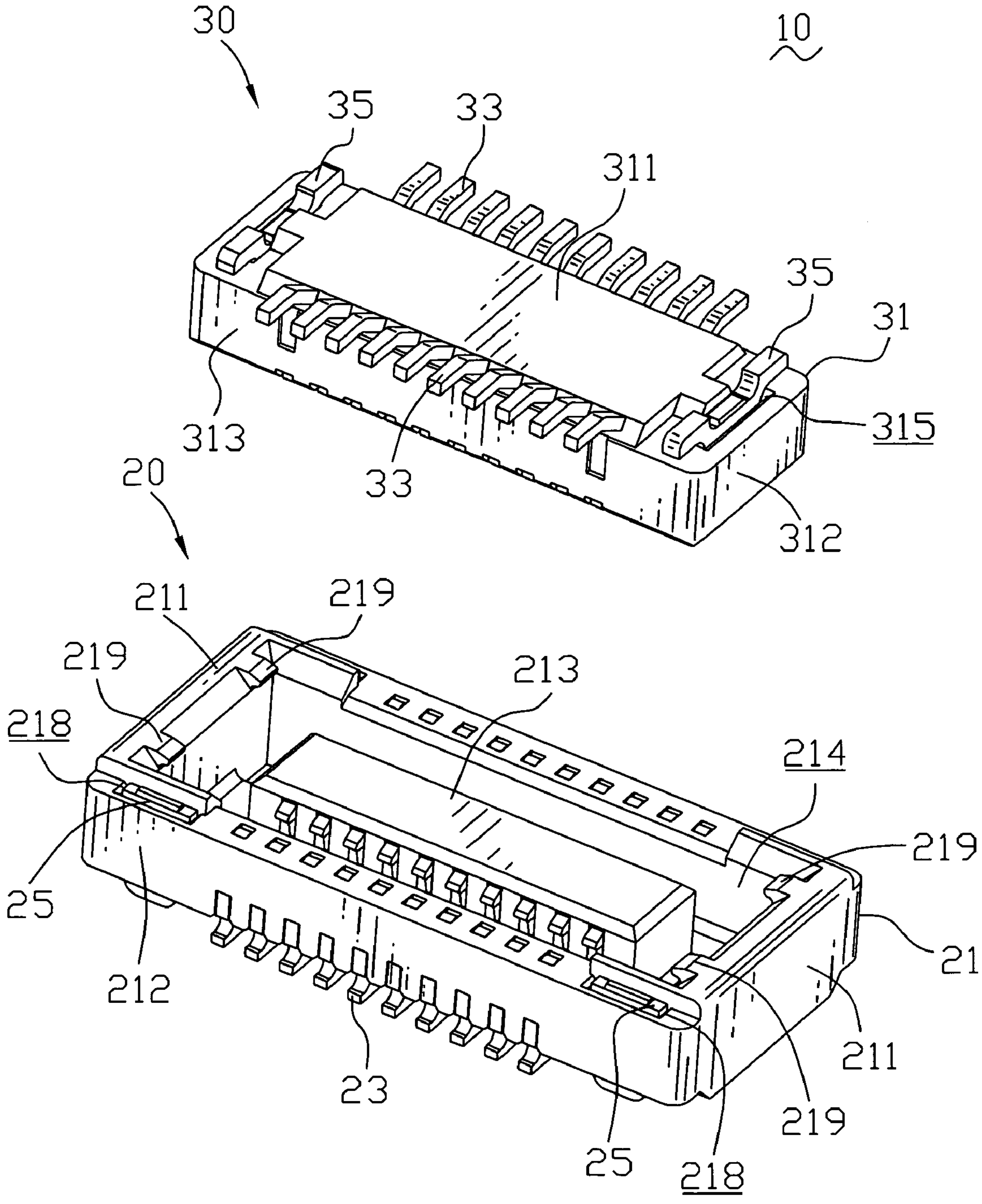
FIG. 2 is a perspective view of the board-to-board connector assembly showing the male connector and the female connector separated.
Figure 3:
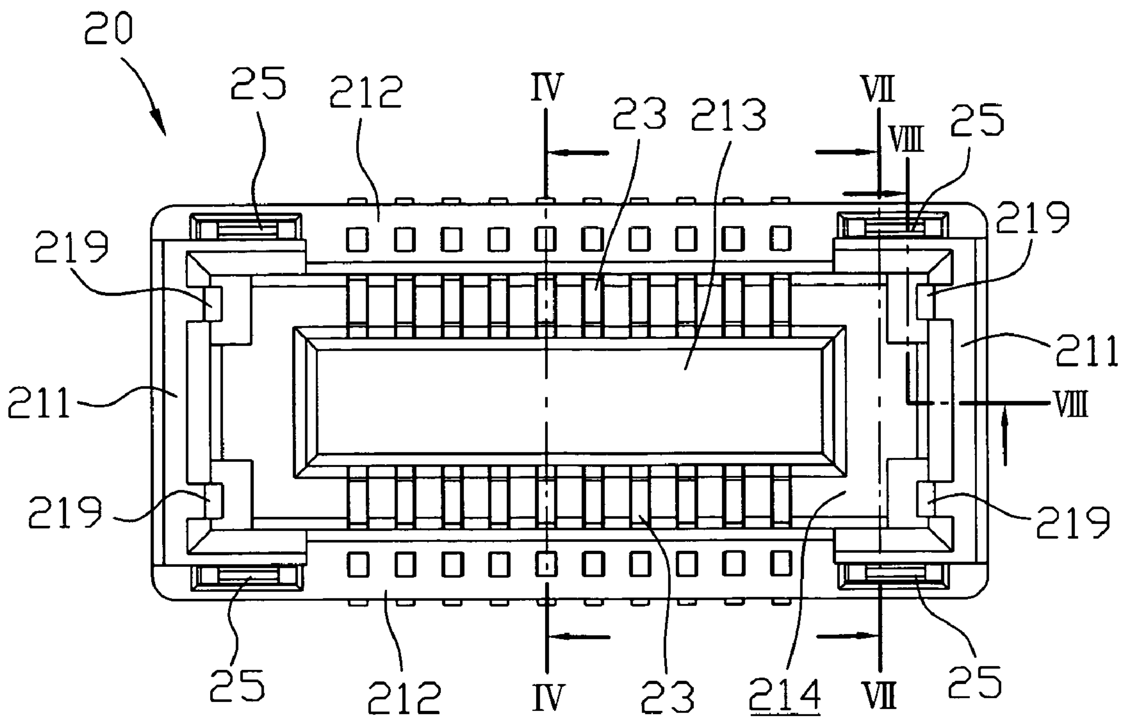
FIG. 3 is a top plane view of the female connector.
Figure 4:
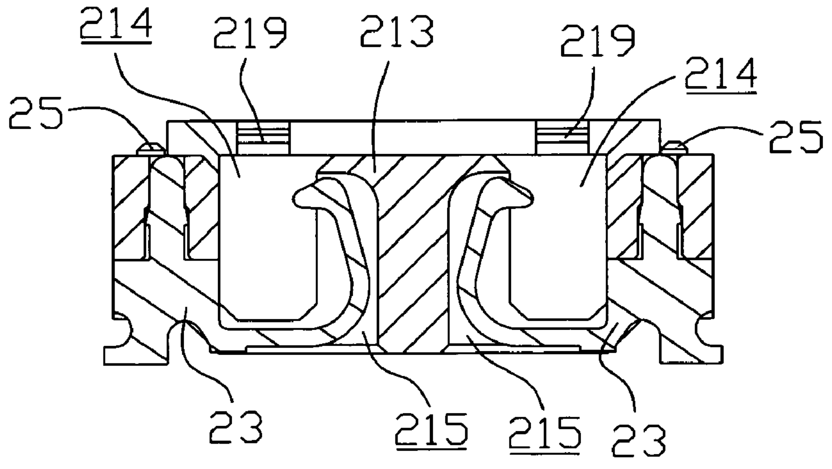
FIG. 4 is a cross-sectional view of the female connector taken along line IV—IV of FIG. 3.

Referring now to FIGS. 2–4, the female connector 20 comprises a female body 21, a plurality of female terminals 23 and a plurality of female welding terminals 25. The female body 21 includes a pedestal 213, end walls 211 and side walls 212. A plurality of female welding holes 218 are formed in the side wall 212 for holding the female welding terminals 25. The pedestal 213 is surrounded by the end walls 211 and the side walls 212, as shown in FIG. 2. The pedestal 213, the end walls 211 and the side walls 212 form a mating channel 214 which the male connector 30 fits in. A plurality of terminal-receiving slots 215 are formed in the side walls 212 and the pedestal 213. The female terminal 23 is inserted in the terminal-receiving slot 215, as shown in FIG. 4.

Figure 7:
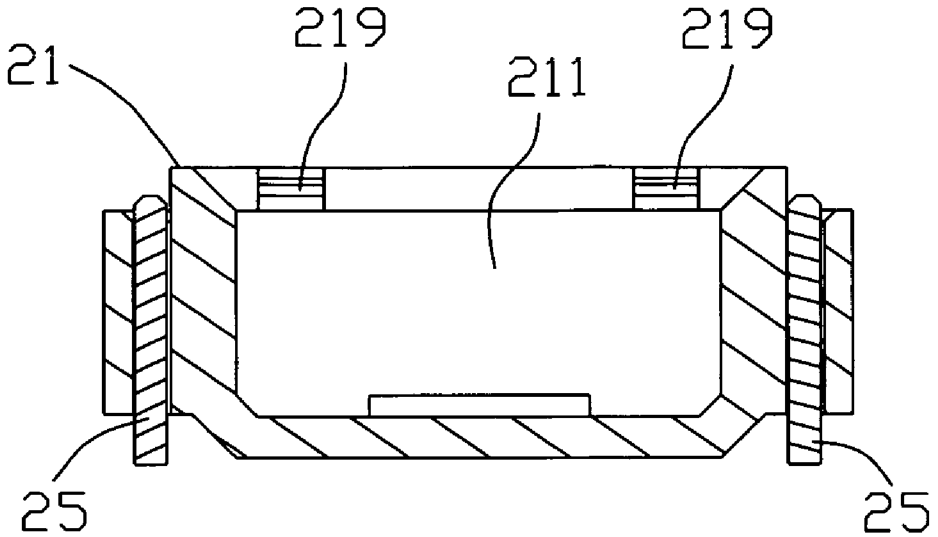
FIG. 7 is a cross-sectional view of the female connector taken along line VII—VII of FIG. 3.
Figure 8:
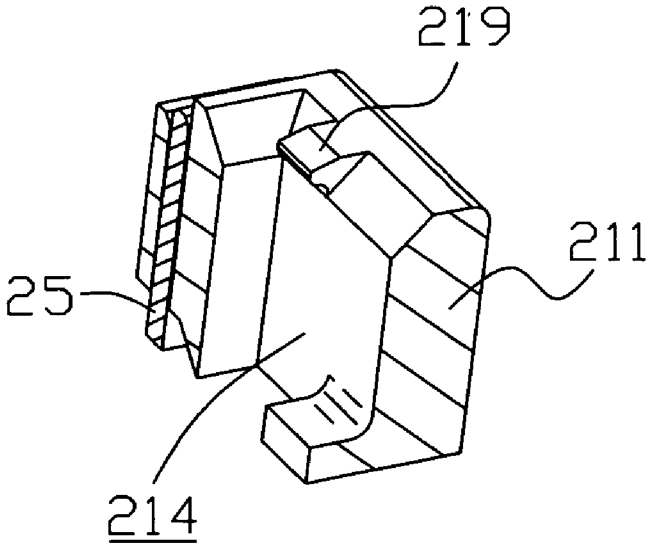
FIG. 8 is a cross-sectional view of the female connector taken along line VIII—VIII of FIG. 3 showing locking projections in more detail.

The end wall 211 is higher than the side wall 212 and includes at least one locking projection 219 arranged on the top portion thereof. As shown in FIG. 7, in this embodiment, each end wall 211 defines two locking projections 219. The locking projection 219 extends to the mating channel 214, shown as FIG. 2 and FIGS. 8–9.

Figure 5:
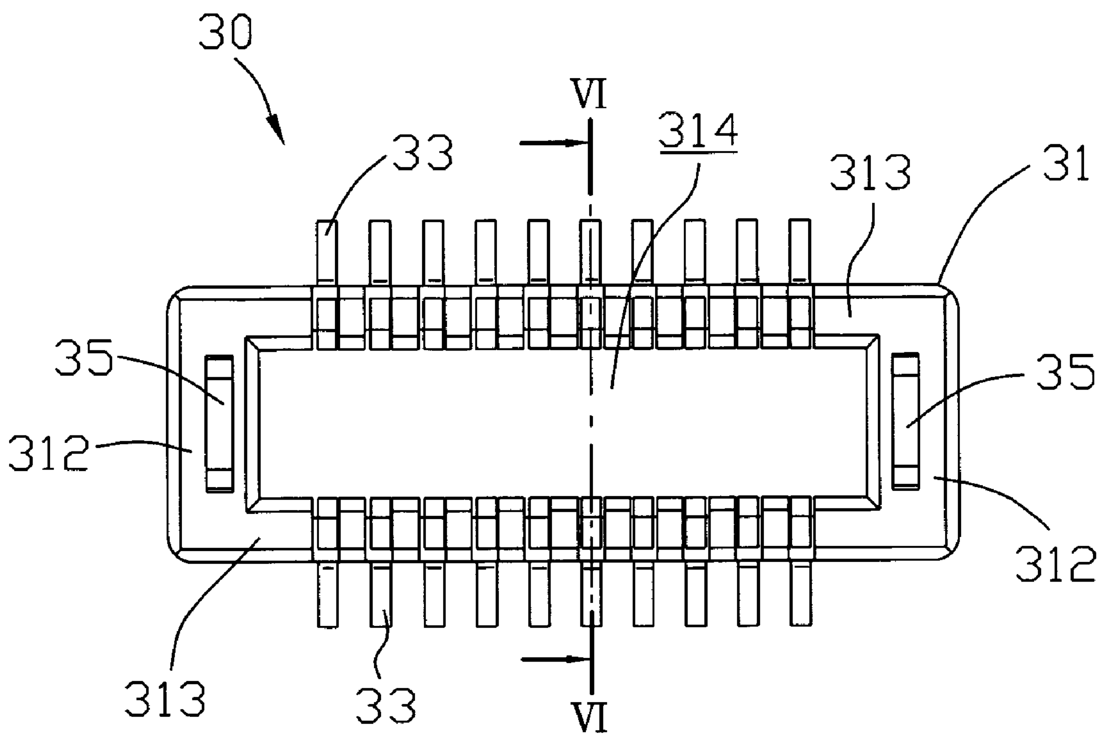
FIG. 5 is a bottom plane view of the male connector.
Figure 6:
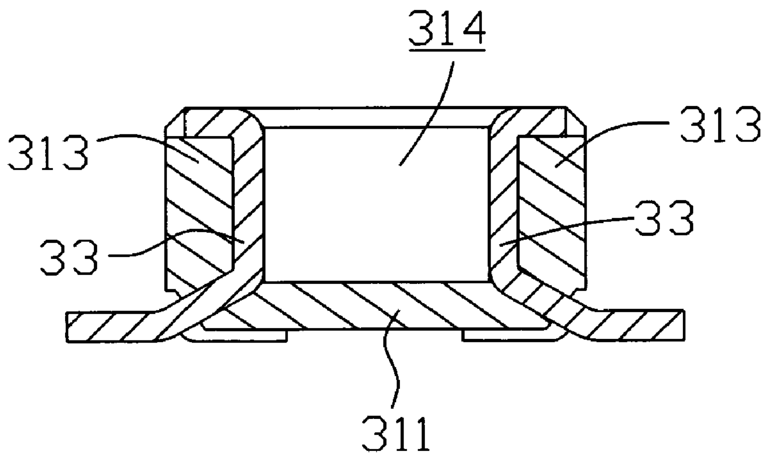
FIG. 6 is a cross-sectional view of the male connector taken along line VI—VI of FIG. 5.

The male connector 30 comprises a male body 31, a plurality of male terminals 33 and a plurality of male welding arms 35, as shown in FIGS. 2 and 5. The male body 31 includes a bottom board 311, end boards 312 and side boards 313. The end boards 312, the side boards 313 and the bottom board 311 form a male housing 314 to couple with the pedestal 213 of the female body 21. A plurality of male welding holes 315 are formed in the side board 312 to hold the male welding arms 35 (shown in FIG. 2). The male terminals 33 are received and fixed in the male body 31, as shown in FIGS. 2 and 6.

Figure 9:
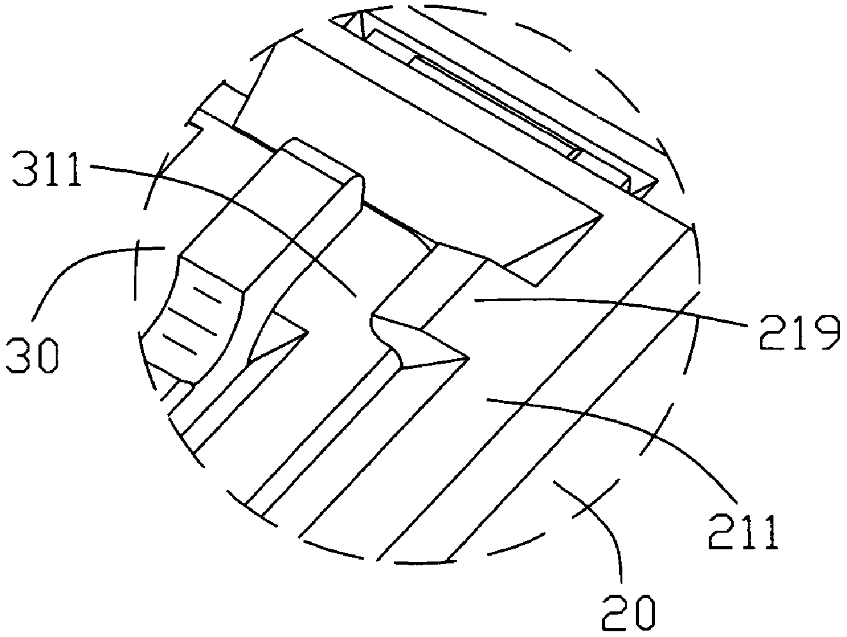
FIG. 9 is an enlarged view of the encircled potion IX of FIG. 1.
Figure 10:
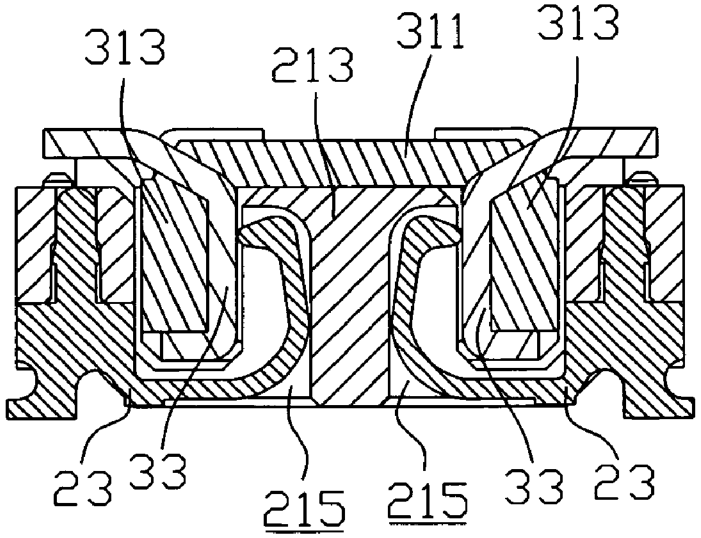
FIG. 10 is a cross-sectional view of the board-to-board connector assembly taken along line X—X of FIG. 1.

Referring to FIGS. 1, 9 and FIG. 10, while the male connector 30 is engaged with the female connector 20, the end boards 312 and side boards 313 are inserted into the mating channel 214. The pedestal 213 of the female body 21 is inserted into the male housing 314, as shown in FIG. 1. When the male connector 30 is completely inserted into the female connector 20, the bottom board 311 of the male connector 30 is pressed and locates below the locking projections 219 (shown in FIG. 9). Then, the male connector 30 is locked by the locking projections 219. By this way, the male connector 30 is firmly engaged with the female connector 20. While the male connector 30 is completely inserted into the female connector 20, the male terminal 33 contacts with the female terminal 23, as shown in FIG. 10.

By adding the locking projections 219 which press the bottom board 311 of the male connector 30, the joint force of the board-to-board connector assembly 10 is increased. Furthermore, false contact and segregation of the male connector 30 and the female connector 20 are avoided. By adding the locking projections 219 on the top portions of the thin end walls 211 of the female body 21, the strength of the female body 21 is increased and the break of the female body 21 is avoided while being hit. By changing the size of the locking projections 219, the joint force is adjusted.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A board-to-board connector assembly comprising:

a female connector including a female body, a plurality of female welding terminals and a plurality of female terminals, the female body comprising:

a plurality of walls, at least one locking projection arranged on a top portion of one of said walls, a pedestal surrounded by said walls, a mating channel formed by said walls and said pedestal, and a plurality of terminal-receiving slots and female welding holes formed in said walls;

said female welding terminals being inserted in said female welding holes; and said female terminals being inserted into said terminal-receiving slots; and a male connector including a male body, a plurality of male terminals received in said male body and a plurality of welding arms, the male body comprising:

a bottom board, end boards and side boards to form a male housing which couples with said pedestal of said female body;

a plurality of male welding holes formed in said side boards;

said welding arms being fixed in said male welding holes; and said at least one locking projection pressing the bottom of said male body when said male connector is inserted in said female connector.

2. The board-to-board connector assembly as claimed in claim 1, wherein said walls of said female body comprise side walls and end walls, said female terminals are inserted along the side walls, and said at least one locking projection is arranged on the top portion of one of said end walls and extends to said mating channel.

* * * * *